(12) United States Patent
Park et al.

(10) Patent No.: US 9,840,785 B2
(45) Date of Patent: Dec. 12, 2017

(54) TIN PLATING SOLUTION, TIN PLATING EQUIPMENT, AND METHOD FOR FABRICATING SEMICONDUCTOR DEVICE USING THE TIN PLATING SOLUTION

(71) Applicant: Samsung Electronics Co., Ltd., Suwon-si (KR)

(72) Inventors: Myung-Beom Park, Hwaseong-si (KR); Jin-Hee Lee, Suwon-si (KR); Baik-Soon Choi, Anyang-si (KR); Jung-Sik Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 402 days.

(21) Appl. No.: 14/578,662

(22) Filed: Dec. 22, 2014

(65) Prior Publication Data

US 2015/0308007 A1    Oct. 29, 2015

(30) Foreign Application Priority Data

Apr. 28, 2014 (KR) .......... 10-2014-0050742

(51) Int. Cl.
| | | |
|---|---|---|
| C25D 3/32 | (2006.01) | |
| H01L 23/00 | (2006.01) | |
| C25D 7/12 | (2006.01) | |
| C25D 5/02 | (2006.01) | |
| C25D 5/50 | (2006.01) | |

(52) U.S. Cl.
CPC .............. *C25D 3/32* (2013.01); *C25D 5/022* (2013.01); *C25D 5/505* (2013.01); *C25D 7/123* (2013.01); *H01L 24/11* (2013.01); *H01L 24/13* (2013.01); *H01L 24/02* (2013.01); *H01L 24/03* (2013.01); *H01L 24/05* (2013.01); *H01L 2224/0239* (2013.01); *H01L 2224/0345* (2013.01); *H01L 2224/0381* (2013.01); *H01L 2224/03614* (2013.01); *H01L 2224/03912* (2013.01); *H01L 2224/0401* (2013.01); *H01L 2224/05008* (2013.01); *H01L 2224/05025* (2013.01); *H01L 2224/05124* (2013.01); *H01L 2224/05155* (2013.01); *H01L 2224/05166* (2013.01); *H01L 2224/05171* (2013.01); *H01L 2224/05569* (2013.01); *H01L 2224/05647* (2013.01); *H01L 2224/05655* (2013.01); *H01L 2224/119* (2013.01); *H01L 2224/1147* (2013.01); *H01L 2224/11462* (2013.01); *H01L 2224/11849* (2013.01); *H01L 2224/11901* (2013.01); *H01L 2224/1308* (2013.01); *H01L 2224/13016* (2013.01); *H01L 2224/13017* (2013.01); *H01L 2224/13019* (2013.01); *H01L 2224/13022* (2013.01); *H01L 2224/13024* (2013.01); *H01L 2224/13025* (2013.01); *H01L 2224/13082* (2013.01); *H01L 2224/13083* (2013.01); *H01L 2224/13111* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2224/81191* (2013.01); *H01L 2924/0105* (2013.01)

(58) Field of Classification Search
CPC ... C25D 3/30; C25D 3/32; C25D 5/10; C25D 5/505
See application file for complete search history.

(56) References Cited

U.S. PATENT DOCUMENTS

| | | | | |
|---|---|---|---|---|
| 2,457,152 | A * | 12/1948 | Hoffman ................ | C25D 3/32 205/301 |
| 4,270,990 | A * | 6/1981 | Fong ................ | C08G 65/2612 205/311 |
| 4,530,741 | A * | 7/1985 | Rosenberg ............. | C25D 3/32 205/303 |
| 4,582,576 | A * | 4/1986 | Opaskar ................ | C25D 3/32 106/1.22 |
| 4,717,460 | A * | 1/1988 | Nobel .................... | C25D 3/32 205/254 |
| 4,880,507 | A * | 11/1989 | Toben .................... | C25D 3/32 205/253 |
| 5,110,423 | A * | 5/1992 | Little .................... | C25D 3/60 106/1.05 |
| 5,174,887 | A * | 12/1992 | Federman ............. | C25D 3/32 205/253 |
| 5,750,017 | A * | 5/1998 | Zhang .................. | C25D 3/32 205/102 |
| 6,013,572 | A | 1/2000 | Hur et al. | |
| 6,476,494 | B1 | 11/2002 | Hur et al. | |
| 7,064,446 | B2 | 6/2006 | Barnak et al. | |
| 7,115,446 | B2 | 10/2006 | Koo et al. | |
| 8,440,065 | B1 * | 5/2013 | Hradil .................. | C25D 17/10 205/238 |
| 2002/0000378 | A1* | 1/2002 | Batz, Jr. ................ | C25D 3/30 205/82 |
| 2003/0150743 | A1* | 8/2003 | Obata .................... | C25D 3/32 205/252 |
| 2003/0201188 | A1* | 10/2003 | Schetty, III .......... | C25D 3/60 205/300 |

(Continued)

FOREIGN PATENT DOCUMENTS

| | | | |
|---|---|---|---|
| JP | 53-073434 | * | 6/1978 |
| JP | 2005-311191 | | 11/2005 |

(Continued)

*Primary Examiner* — Harry D Wilkins, III
(74) *Attorney, Agent, or Firm* — Myers Bigel, P.A.

(57) ABSTRACT

A tin plating solution and a method for fabricating a semiconductor device are provided. The tin plating solution comprises tin ions supplied from a soluble tin electrode, an aliphatic sulfonic acid having a carbon number of 1 to 10, an anti-oxidant, a wetting agent, and a grain refiner that is an aromatic carbonyl compound.

20 Claims, 9 Drawing Sheets

(56) References Cited

U.S. PATENT DOCUMENTS

| | | | |
|---|---|---|---|
| 2004/0121267 A1 | 6/2004 | Jang | |
| 2004/0251546 A1 | 12/2004 | Lee et al. | |
| 2005/0077082 A1* | 4/2005 | Fang | C25D 3/32 174/261 |
| 2007/0158204 A1* | 7/2007 | Taylor | C25D 3/30 205/300 |
| 2008/0269395 A1* | 10/2008 | Reddington | C25D 3/38 524/440 |
| 2012/0132530 A1* | 5/2012 | Hayashi | H05K 3/062 205/125 |
| 2013/0309862 A1* | 11/2013 | Hatta | C25D 5/10 438/615 |
| 2015/0267310 A1* | 9/2015 | Ikumoto | C25D 3/32 205/125 |
| 2016/0130712 A1* | 5/2016 | Hori | C25D 3/32 205/125 |

FOREIGN PATENT DOCUMENTS

| | | |
|---|---|---|
| JP | 4922251 B2 | 4/2012 |
| JP | 2012-114256 | 6/2012 |
| KR | 100219806 B1 | 6/1999 |
| KR | 1020010070013 | 7/2001 |
| KR | 1020050050155 | 5/2005 |
| KR | 1020060128559 | 12/2006 |
| KR | 100769966 B1 | 10/2007 |
| KR | 100792663 B1 | 1/2008 |
| KR | 100831025 B1 | 5/2008 |
| KR | 1020120044521 | 6/2012 |
| WO | WO 01/63668 A2 * | 8/2001 |

* cited by examiner

[Fig. 1]
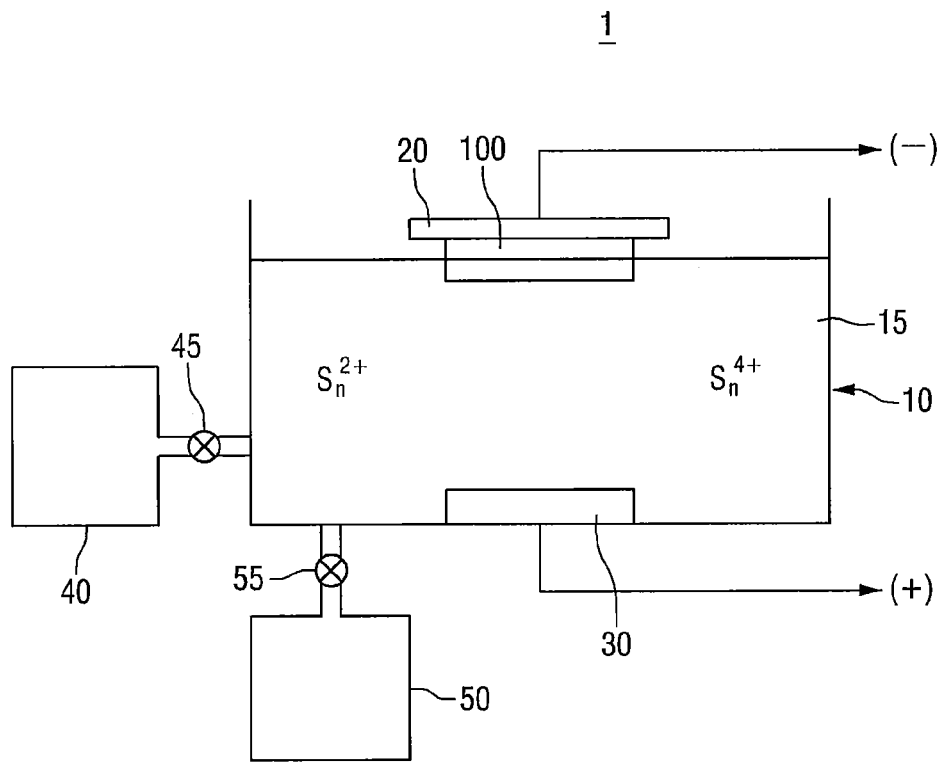
[Fig. 2]
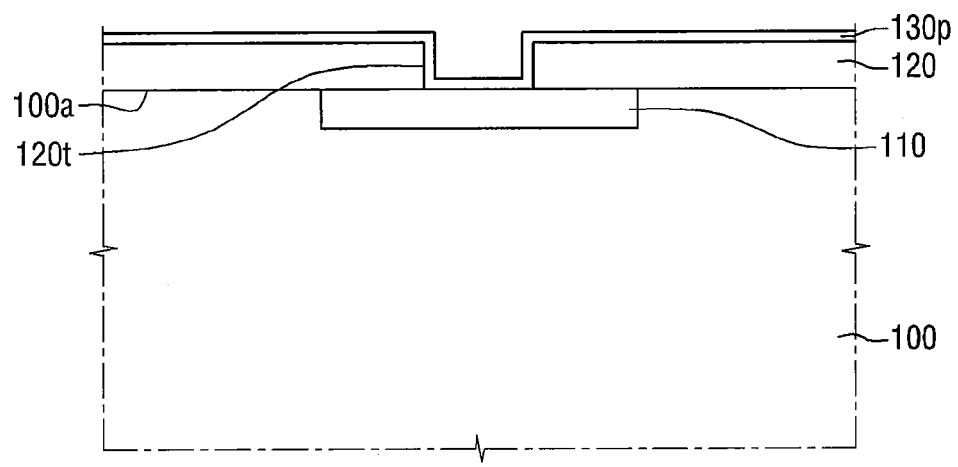

[Fig. 3]
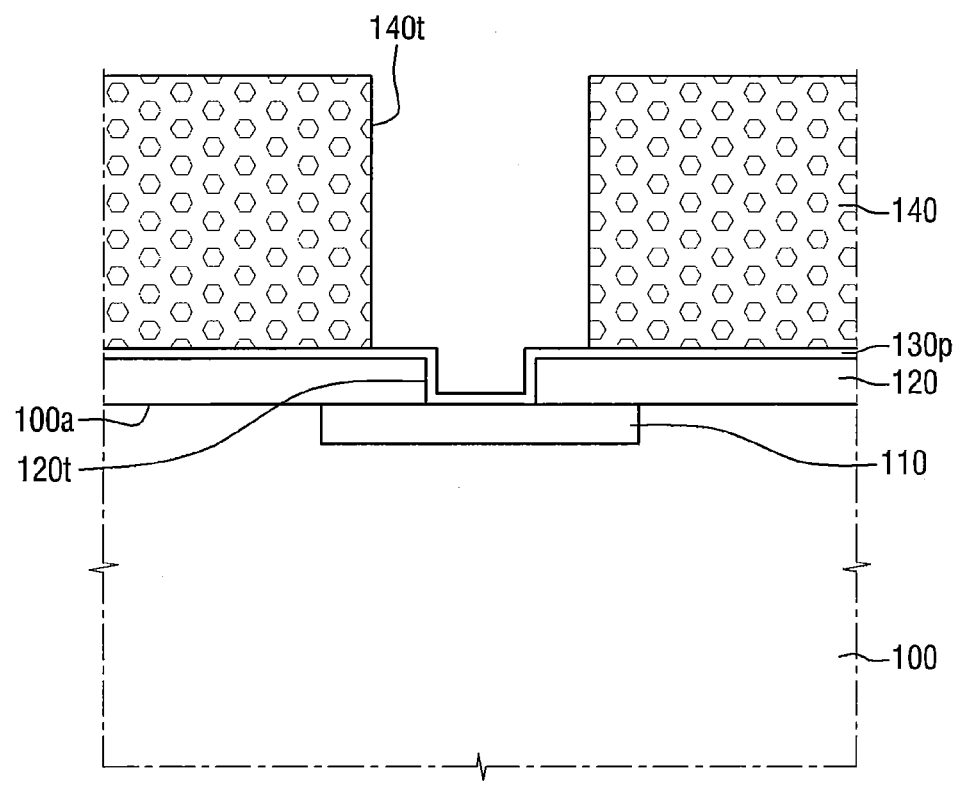

[Fig. 4]
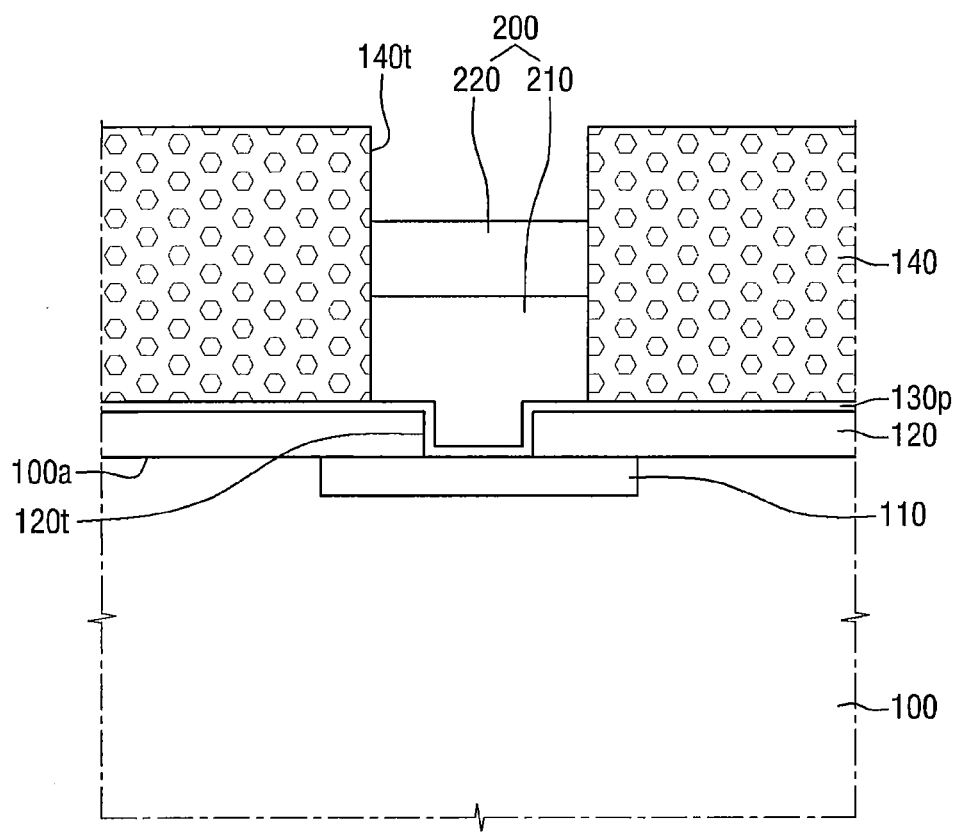

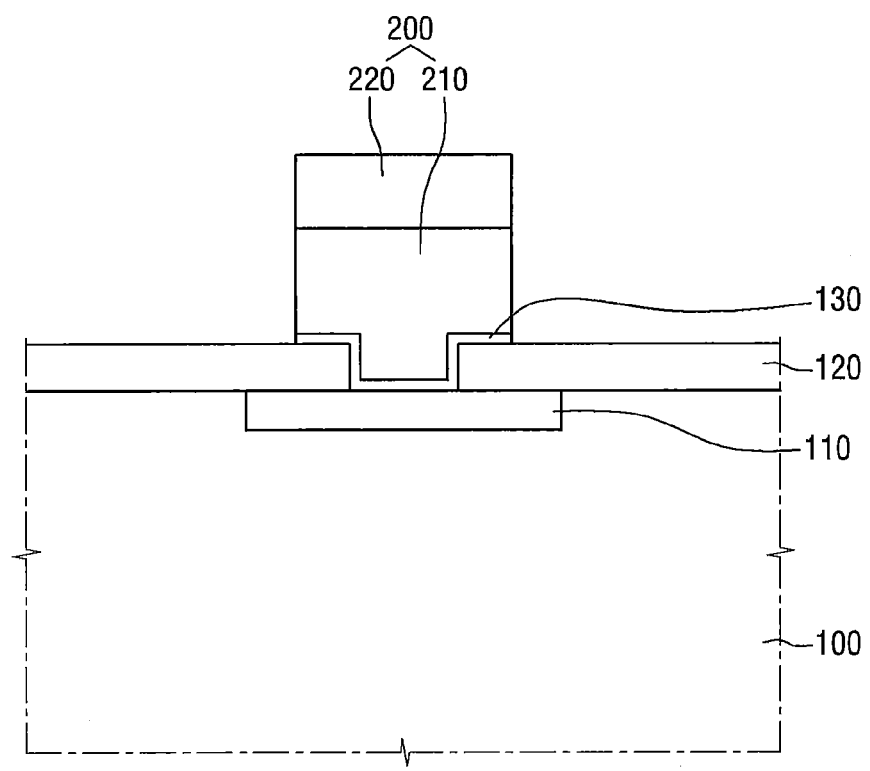
[Fig. 5]

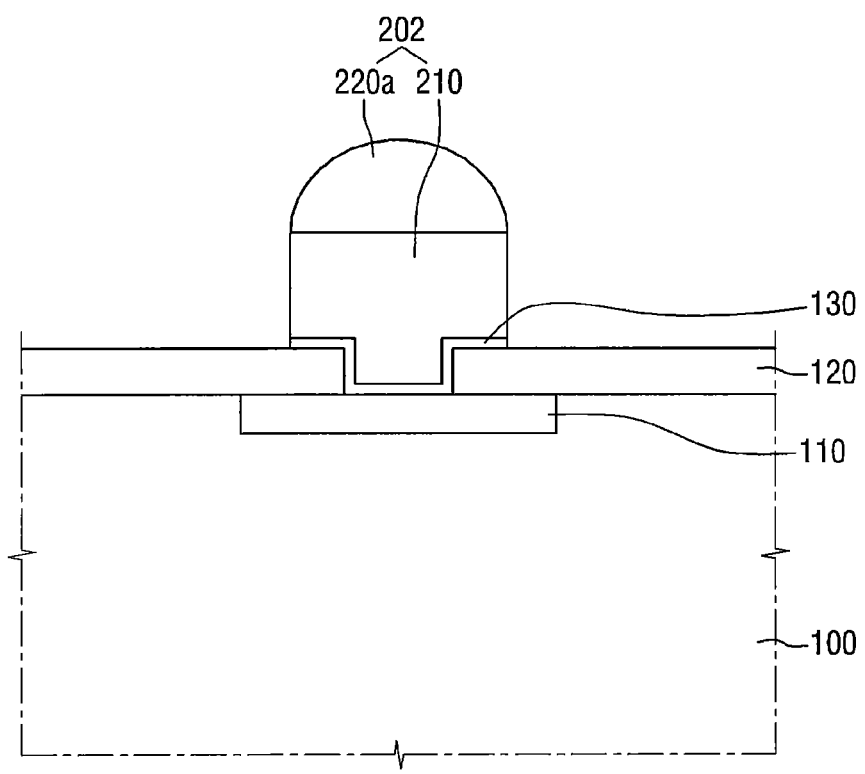
[Fig. 6]

[Fig. 7]
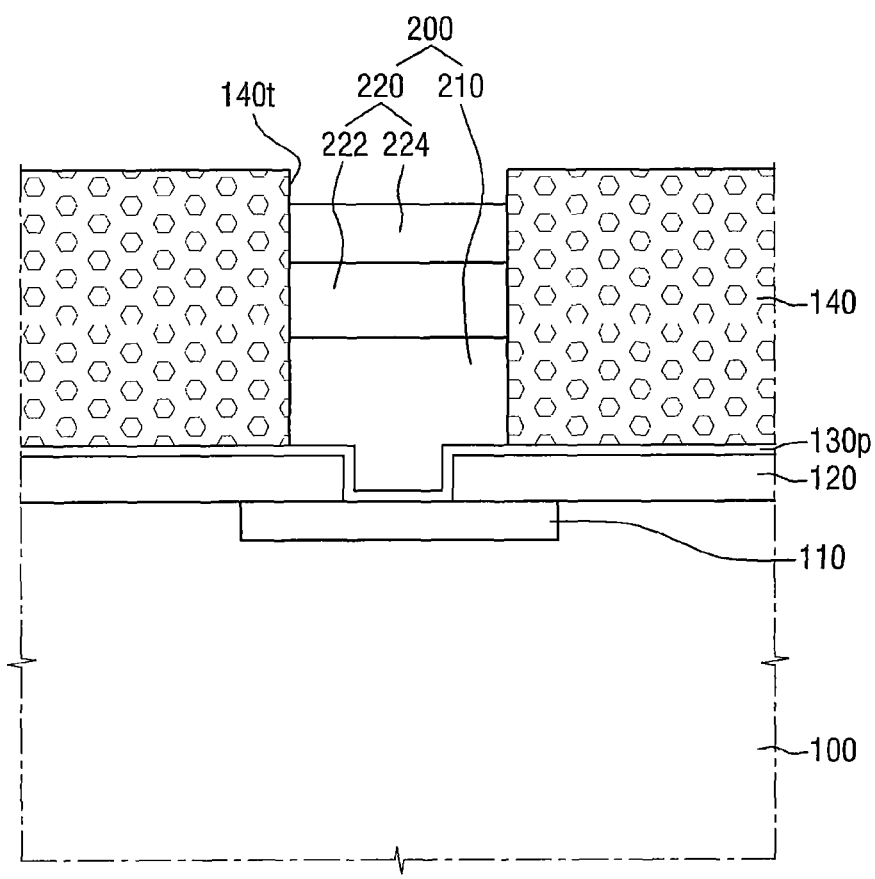

【Fig. 8】
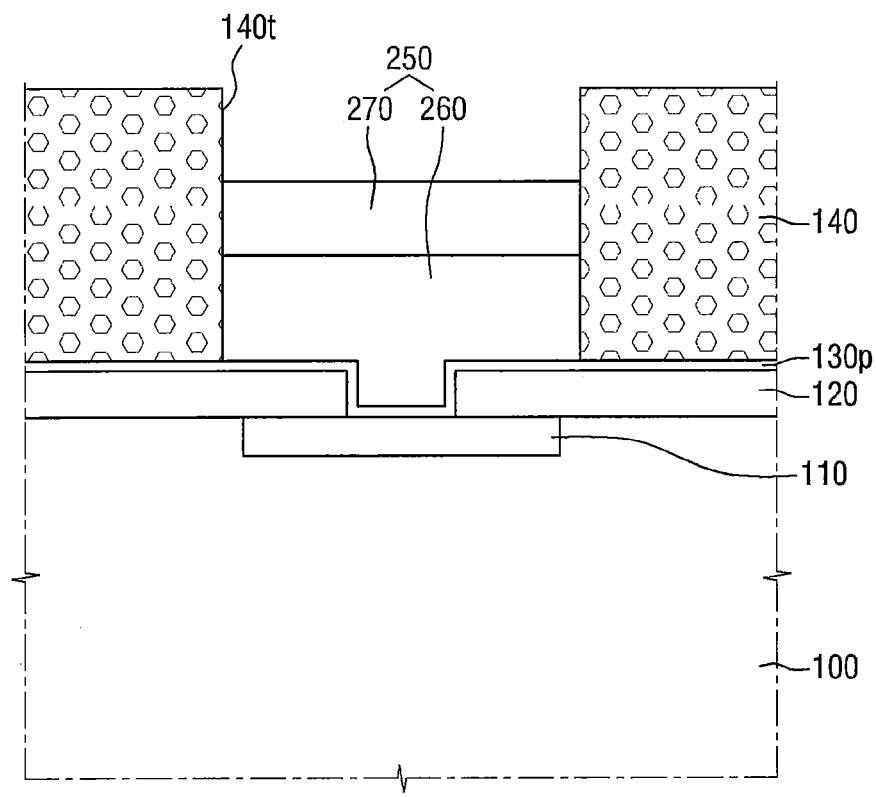

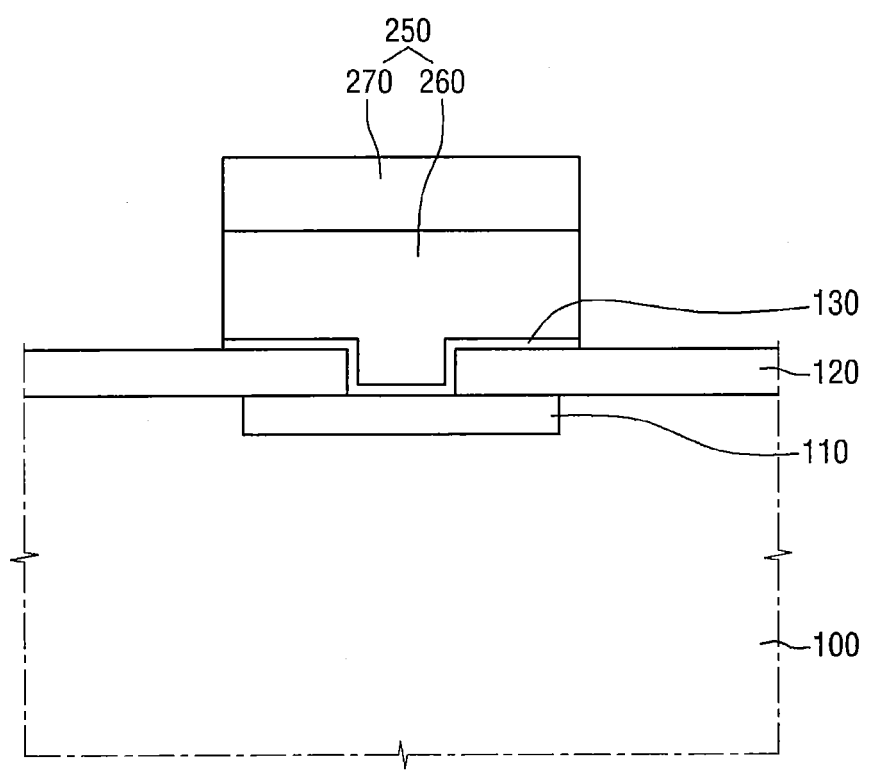
[Fig. 9]

[Fig. 10]
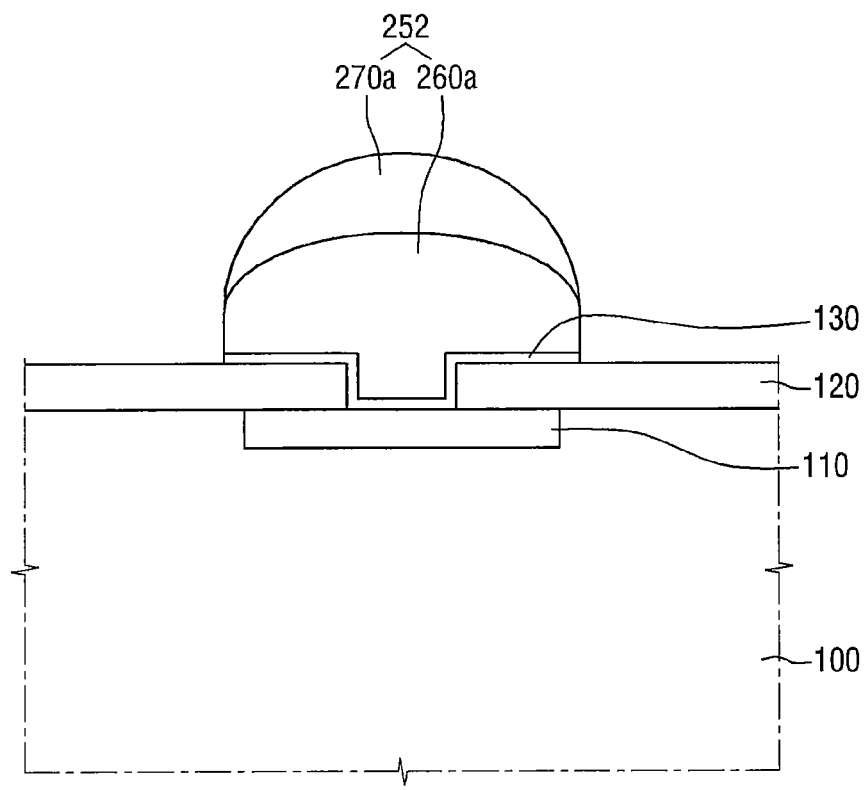
[Fig. 11]
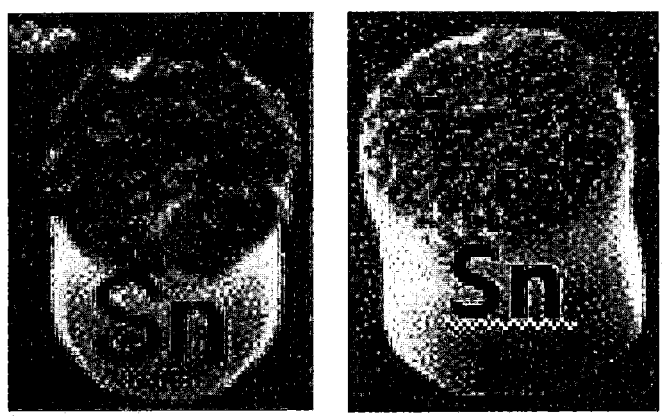

TIN PLATING SOLUTION, TIN PLATING EQUIPMENT, AND METHOD FOR FABRICATING SEMICONDUCTOR DEVICE USING THE TIN PLATING SOLUTION

CROSS-REFERENCE TO RELATED APPLICATION

This application claims priority under 35 U.S.C. §119 to Korean Patent Application No. 10-2014-0050742 filed on Apr. 28, 2014, in the Korean Intellectual Property Office, the disclosure of which is hereby incorporated herein in its entirety by reference.

FIELD

The present invention relates to a tin plating solution, tin plating equipment, and a method for fabricating a semiconductor device using the tin plating solution.

BACKGROUND

As the size of a semiconductor device is reduced, the size of a connection terminal (e.g., solder ball or solder bump) that is formed in the semiconductor device is gradually decreased. Such a connection terminal may be formed, for example, through an electroplating method.

When the connection terminal is formed using the electroplating method, various researches for securing reliability of the plated connection terminal as increasing the speed of forming the connection terminal have been made.

SUMMARY

According to an embodiment, a tin plating solution, which can improve the reliability of a semiconductor device through reduction of a grain size of a plated bump, is provided.

According to an embodiment, a method for fabricating a semiconductor device using the tin plating solution is provided.

In an embodiment, there is provided a tin plating solution comprising tin ions supplied from a soluble tin electrode, an aliphatic sulfonic acid having a carbon number of 1 to 10, an anti-oxidant, a wetting agent, and a grain refiner that is an aromatic carbonyl compound.

The grain refiner is expressed by Formula 1 below,

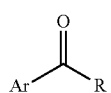

[Formula 1]

in Formula 1, Ar is at least one aromatic ring.

In Formula 1, R is one selected from the group consisting of hydrogen group (—H), paraffin group (—$C_nH_{2n+1}$), and cycloparaffin group (—$C_mH_{2m-1}$), and n is equal to or larger than 1, and m is equal to or larger than 2.

The wetting agent is a polycyclic aromatic compound.

The polycyclic aromatic compound is expressed by Formula 2 below,

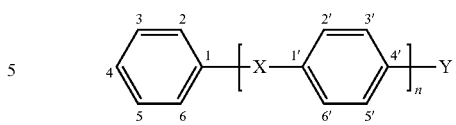

[Formula 2]

in Formula 2, n is among 1 to 3, X includes at least one of O, S, SO, SO2, CH2, CH2CH2, CH2CH2CH2 and CHCH3, and Y is one selected from the group consisting of a hydrogen group, hydroxyl group, sulfhydryl group, alkyl group having carbon number of 1 to 24, aliphatic alkoxyl group, alkyl thioalkoxyl group having carbon number of 1 to 10, fluorine group, chloro group, and bromo group.

An alkyl group having a carbon number of 10 to 24 is combined with one position of 3 to 5 of Formula 2.

The polycyclic aromatic compound is expressed by Formula 3 below,

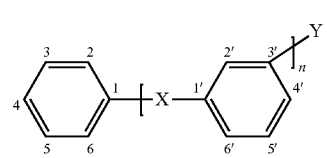

[Formula 3]

where, in Formula 3, n is among 1 to 3, X includes at least one of O, S, SO, SO2, CH2, CH2CH2, CH2CH2CH2 and CHCH3, and Y is one selected from the group consisting of a hydrogen group, hydroxyl group, sulfhydryl group, alkyl group having carbon number of 1 to 24, aliphatic alkoxyl group, alkyl thioalkoxyl group having carbon number of 1 to 10, fluorine group, chloro group, and bromo group.

An alkyl group having a carbon number of 10 to 24 is combined with one position of 3 to 5 of Formula 3.

The polycyclic aromatic compound is expressed by Formula 4 below,

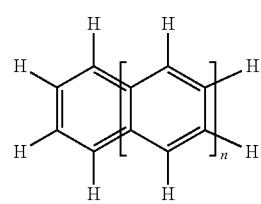

[Formula 4]

where, in Formula 4, n is among 1 to 6.

The aliphatic sulfonic acid is a methane sulfonic acid.

The anti-oxidant comprises one of hydroquinone and orange acid.

A concentration of the aliphatic sulfonic acid is 225 to 350 ml/L.

A concentration of the tin ions is 50 to 100 g/L.

In another aspect of the present invention, there is provided a method for fabricating a semiconductor device comprising forming a contact pad on a substrate, and forming a pure tin bump on the contact pad using a tin plating solution, wherein the tin plating solution includes an aliphatic sulfonic acid having a carbon number of 1 to 10, an anti-oxidant, a wetting agent that is a polycyclic aromatic compound, and a grain refiner that is an aromatic carbonyl compound.

The grain refiner is expressed by Formula 1 below,

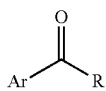

[Formula 1]

where, in Formula 1, Ar is at least one aromatic ring, and R is one selected from the group consisting of hydrogen group (—H), paraffin group (—CnH2n+1), and cycloparaffin group (—CmH2m−1), and n is equal to or larger than 1, and m is equal to or larger than 2.

The polycyclic aromatic compound is expressed by Formula 2, 3, or 4 below,

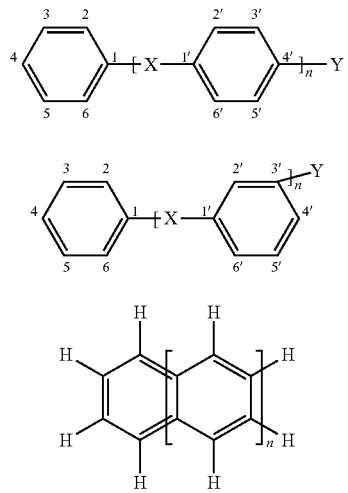

[Formula 2]

[Formula 3]

[Formula 4]

where, in Formula 2 and Formula 3, n is among 1 to 3, X includes at least one of O, S, SO, SO2, CH2, CH2CH2, CH2CH2CH2 and CHCH3, and Y is one selected from the group consisting of a hydrogen group, hydroxyl group, sulfhydryl group, alkyl group having carbon number of 1 to 24, aliphatic alkoxyl group, alkyl thioalkoxyl group having carbon number of 1 to 10, fluorine group, chloro group, and bromo group, and in Formula 4, n is among 1 to 6.

An alkyl group having a carbon number of 10 to 24 is combined with one position of 3 to 5 of the Formula 2 or the Formula 3.

The forming the pure tin bump comprises forming a photosensitive layer pattern that includes an opening formed on the contact pad, forming a pure tin layer that fill a part of the opening using the tin plating solution, and performing heat treatment of the pure tin layer through a reflow process.

The method may further comprise forming a conductive layer that fills a part of the opening on the pure tin layer after forming the pure tin layer.

The method may further comprise forming a conductive layer that fills a part of the opening before forming the pure tin layer.

BRIEF DESCRIPTION OF THE DRAWINGS

The above and other objects, features and advantages of the present invention will be more apparent from the following detailed description taken in conjunction with the accompanying drawings, in which:

FIG. 1 is a view explaining tin plating equipment according to an embodiment of the present invention;

FIGS. 2 to 6 are views explaining a method for fabricating a semiconductor device according to an embodiment of the present invention;

FIG. 7 is a view explaining a method for fabricating a semiconductor device according to another embodiment of the present invention;

FIGS. 8 to 10 are views explaining a method for fabricating a semiconductor device according to still another embodiment of the present invention; and FIG. 11 is a view illustrating a measured tin bump formed using the tin plating solution.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

The term "alkyl" means an aliphatic hydrocarbon group. Alkyl moiety may be a "saturated alkyl" group that does not include any alkene or alkyne moiety. The alkyl moiety may also be an "unsaturated alkyl" moiety that includes at least one alkene or alkyne moiety. The alkene moiety means a group in which at least two carbon atoms form at least one carbon-carbon double bond, and the alkyne moiety means a group in which at least two carbon atoms form at least one carbon-carbon triple bond.

The alkyl group may be substituted or non-substituted. In the case of substitution, substitution groups are one or more groups individually and independently selected from the group consisting of cycloalkyl, aryl, heteroaryl, heteroalycyclic, hydroxy, alkoxy, aryloxy, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sufonamido, N-sufonamido, C-carboxy, O-carboxy, isocyanato, thiocyanato, isothiocyanato, nitro, cyril, trihalomethanesufonyl, amino including mono- and di-substituted amino groups, and their protection derivatives. The typical alkyl group includes methyl, ethyl, propyl, isopropyl, butyl, isobutyl, tertiary butyl, pentyl, hexyl, etinyl, ethernyl, propenyl, butenyl, cyclopropyl, cyclobutyl, cyclopentyl, and cyclohexyl, but is not limited thereto.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, referring to FIG. 1, tin plating equipment according to an embodiment of the present invention will be described.

FIG. 1 is a view explaining tin plating equipment according to an embodiment of the present invention.

Referring to FIG. 1, tin plating equipment 1 may include a plating solution bath 10, a tin plating solution 15, a cathode 20, and an anode 30.

The plating solution bath 10 is a container that contains the tin plating solution 15 for tin plating. The plating solution bath 10 may be a water bath in which a predetermined temperature is maintained while the tin plating is performed, but is not limited thereto.

The tin plating equipment 1 may further include a first storage bath 40 and a second storage bath for providing constituent elements included in the tin plating solution 15 to the plating solution bath 10.

The first storage bath 40 may store an electrolyte to be provided to the plating solution bath 10. If the concentration of the electrolyte in the tin plating solution 15 that is contained in the plating solution bath 10 is changed, the first storage bath 40 provides the electrolyte to the plating solution bath 10. The details of the electrolyte will be described later in association with the description of the tin plating solution 15.

A first valve 45 is positioned between the first storage bath 40 and the plating solution bath 10. The first valve 45 controls a flow of electrolyte from the first storage bath 40 to the plating solution bath 10. For example, if the concentration of the electrolyte in the tin plating solution 15 that is contained in the plating solution bath 10 is changed, the first valve 45 is opened to provide the electrolyte from the first storage tank 40 to the plating solution bath 10.

The second storage bath 50 may store additives to be provided to the plating solution bath 10. If the concentration of the additives in the tin plating solution 15 that is contained in the plating solution bath 10 is changed, the second storage tank 50 provides the additives to the plating solution bath 10. The details of the additives will be described later in association with the description of the tin plating solution 15.

A second valve 55 is positioned between the second storage bath 50 and the plating solution bath 10. The second valve 55 controls a flow of additives from the second storage bath 50 to the plating solution bath 10. For example, if the concentration of the additives in the tin plating solution 15 that is contained in the plating solution bath 10 is changed, the second valve 55 is opened to provide the additives from the second storage tank 50 to the plating solution bath 10.

FIG. 1 illustrates there is one second storage bath 50 for storing the additives, but is not limited thereto. That is, if several kinds of additives are provided, storage baths for storing the several kinds of additives may be provided, or one storage bath may be provided to store the various kinds of additives as a mixture.

The cathode 20 may fix a substrate 100 on which the tin plating is to be performed. The cathode 20 may apply a voltage to the substrate 100 on which the tin plating is to be performed. For example, if the cathode 20 applies a negative voltage to the substrate 100, tin anions included in the tin plating solution are substituted on the substrate 100 to produce tin.

The anode 30 provides tin ions to the tin plating solution 15. The anode 30 is positioned in the plating solution bath 10, and as an example, is soaked in the tin plating solution 15. For example, the anode 30 is connected to an external power supply, and more particularly, is connected to a positive terminal of the power supply.

In the tin plating equipment according to an embodiment of the present invention, the anode 30 is an electrode that is made of, for example, pure tin. In an embodiment, the anode 30 is a soluble tin electrode. When the anode 30 is made of pure tin, the anode 30 provides only tin ions to the tin plating solution 15, and does not provide other metal ions to the tin plating solution 15.

When the anode 30 that is a soluble tin electrode is used, it is not necessary to supplement tin ions to the plating solution bath 10, and thus it can contribute to the improvement of productivity. Further, when the tin ions can be constantly supplied from the soluble tin electrode, the change of the concentration of tin ions in the tin plating solution 15 can be minimized. Through this, the process inferiority can be reduced, and the productivity can be improved.

Hereinafter, the tin plating solution 15 that is contained in the plating solution bath 10 will be described.

The tin plating solution 15 includes tin ions, electrolytes, and additives. The tin plating solution 15 according to an embodiment of the present invention may not include other metal ions except for the tin ions.

The tin ions are supplied from the soluble tin electrode. The tin ions are ionized into the electrolyte. That is, the tin ions exist in the tin plating solution 15 in an ionized state. The tin ions may exist in the tin plating solution in the form of $Sn^{2+}$ having a valence of 2 or $Sn^{4+}$ having a valence of 4.

In the tin plating solution 15, the concentration of tin, i.e., the concentration of tin ions, may be, for example, 900 g/L, and more particularly, the concentration of tin ions may be 50 to 100 g/L.

The electrolyte serves as a solvent of the tin plating solution 15. During the tin plating, the electrolyte is used as a movement path through which the tin ions can move. The electrolyte may include a material through which current flows.

The electrolyte may include an acid material, and for example, may include aliphatic sulfonic acid. In an embodiment, the aliphatic sulfonic acid may be alkane sulfonic acid. The electrolyte may be, for example, alkane sulfonic acid having the carbon number of 1 to 10.

In the tin plating solution according to an embodiment of the present invention, the electrolyte may be methane sulfonic acid, but is not limited thereto.

Further, in the tin plating solution 15, the concentration of the aliphatic sulfonic acid that is the electrolyte may be, for example, 10 to 990 ml/L, and more particularly, may be 225 to 350 ml/L.

The additives included in the tin plating solution 15 may include an anti-oxidant, a wetting agent, and a grain refiner.

The anti-oxidant serves to prevent a tin layer that is formed by the electroplating from being oxidized. That is, if the electrolyte is aliphatic sulfonic acid, the tin layer that is grown by the tin plating solution 15 may be oxidized by the electrolyte simultaneously with the plating. Accordingly, the anti-oxidant serves to prevent the tin layer that is formed by the electroplating from being oxidized to protect the tin layer.

The anti-oxidant may include, for example, one of hydroquinone and orange acid.

In the tin plating solution 15, the concentration of the anti-oxidant may be, for example, 10 ppb to 500 g/L, and preferably, may be 100 ppb to 10 g/L.

The wetting agent serves to reduce the surface tension of the tin plating solution 15 during the electroplating and to rapidly wet a region on which the tin layer is to be formed by means of the tin plating solution. That is, the wetting agent helps the approach of the tin plating solution 15 to the region on which the tin layer is to be formed and serves to make the tin ions included in the tin plating solution 15 well stick to the region on which the tin layer is to be formed.

In the tin plating solution according to an embodiment of the present invention, the wetting agent may be a polycyclic aromatic compound.

For example, an example of a polycyclic aromatic compound that is used as the wetting agent included in the tin plating solution 15 according to the present invention may be a compound that is expressed by Formula 2.

[Formula 2]

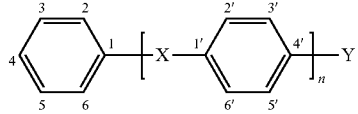

In Formula 2, n is among 1 to 3. In Formula 2, X includes at least one of O, S, SO, SO2, CH2, CH2CH2, CH2CH2CH2 and CHCH3, and Y is one selected from the group consisting of a hydrogen group, hydroxyl group, sulthydryl group, alkyl group having carbon number of 1 to 24, aliphatic alkoxyl group, alkyl thioalkoxyl group having carbon number of 1 to 10, fluorine group, chloro group, and bromo group. In some embodiments, the alkyl group has a carbon number of 1 to 10 or 10 to 24.

Further, in the wetting agent, an alkyl group having the carbon number of 10 to 24 may be combined with one position of 3 to 5 of Formula 2 explained as an example of the polycyclic aromatic compound. That is, the polycyclic aromatic compound that is the wetting agent may further include an alkyl group having the carbon number of 10 to 24 combined with a meta position or a para position of a benzene ring on the left side of Formula 2.

As another example, another example of the polycyclic aromatic compound that is used as the wetting agent included in the tin plating solution 15 according to the present invention may be a compound expressed by Formula 3 below.

[Formula 3]

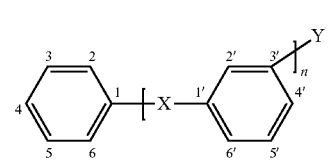

In Formula 3, n is among 1 to 3. In Formula 3, X includes at least one of O, S, SO, SO2, CH2, CH2CH2, CH2CH2CH2 and CHCH3, and Y is one selected from the group consisting of a hydrogen group, hydroxyl group, sulfhydryl group, alkyl group having carbon number of 1 to 24, aliphatic alkoxyl group, alkyl thioalkoxyl group having carbon number of 1 to 10, fluorine group, chloro group, and bromo group. In some embodiments, the alkyl group has a carbon number of 1 to 10 or 10 to 24. Further, in the wetting agent, an alkyl group having the carbon number of 10 to 24 may be combined with one position of 3 to 5 of Formula 3 explained as an example of the polycyclic aromatic compound. That is, the polycyclic aromatic compound that is the wetting agent may further include an alkyl group having the carbon number of 10 to 24 combined with a meta position or a para position of a benzene ring on the left side of Formula 3.

As another example, another example of the polycyclic aromatic compound that is used as the wetting agent included in the tin plating solution 15 according to the present invention may be a compound expressed by Formula 4 below.

[Formula 4]

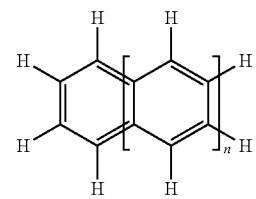

In Formula 4, n is among 1 to 6.

In the tin plating solution 15, the concentration of the wetting agent may be, for example, 10 ppb to 500 g/L, and preferably, 1 g/L to 200 g/L.

The grain refiner serves to adjust the grain size of the tin that is formed by electroplating. In an embodiment, the tin layer that is formed by plating is a polycrystalline tin layer that is formed through combination of a large number of tin crystals.

In the polycrystalline tin layer, if any one tin crystal becomes enormous, the surface of the tin layer that is formed by the plating may become rough. The tin layer having such a rough surface may cause inferiority in the following process after the tin layer is formed. Further, if the tin crystals are grown only in one direction and whisker is generated during the electroplating, the generated whisker is connected to the adjacent tin layer to cause processing inferiority.

Accordingly, the grain refiner improves the roughness of the surface of the plated tin layer through adjustment of the grain size of the tin that is formed by the electroplating. Further, the grain refiner prevents the plated tin layer from growing in a whisker type needle shape.

In the tin plating solution according to an embodiment of the present invention, the grain refiner may be an aromatic carbonyl compound.

For example, the aromatic carbonyl compound that is used as the grain refiner included in the tin plating solution 15 may be a compound expressed by Formula 1.

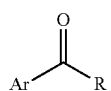

[Formula 1]

In Formula 1, Ar may be at least one aromatic ring. Further, in Formula 1, R is one selected from the group consisting of hydrogen group (—H), paraffin group (—CnH2n+1), and cycloparaffin group (—CmH2m−1). Here, n is equal to or larger than 1, and m is equal to or larger than 2.

In the tin plating solution 15, the concentration of the grain refiner may be, for example, 10 ppb to 500 g/L, and preferably may be 100 ppb to 10 g/L.

Referring to FIGS. 2 to 6, a method for fabricating a semiconductor device according to an embodiment of the present invention will be described.

FIGS. 2 to 6 are views of intermediate steps explaining a method for fabricating a semiconductor device according to an embodiment of the present invention.

Referring to FIG. 2, a contact pad 110 is formed on one surface 100a of the substrate 100.

The substrate 100 may be, for example, a substrate in the unit of a wafer or a substrate in the unit of a chip that is separated from the wafer. If the substrate 100 is a substrate in the unit of a separated chip, the substrate 100 may be a memory chip or a logic chip. If the substrate 100 is a logic chip, it may be variously designed in consideration of operations to be performed. If the substrate 100 is a memory chip, the memory chip may be, for example, a nonvolatile memory chip. Specifically, the memory chip may be a flash memory chip. In an embodiment, the memory chip may be either a NAND flash memory chip or NOR flash memory chip. The shape of the memory device according to the technical idea of the present invention is not limited thereto. In some embodiments of the present invention, the memory chip may include at least one of a PRAM (Phase-change Random-Access Memory), MRAM (Magneto-resistive Random-Access Memory), and RRAM (Resistive Random-Access Memory). If the substrate 100 is a substrate in the unit of a wafer, the substrate 100 may include logic devices or memory devices that perform the above-described functions.

The contact pad 110 may be a bonding pad for electrically connecting external terminals to a circuit pattern in the substrate 100, but is not limited thereto. The contact pad 110 may be rewired or may be a pad that is formed on a TSV (Through Silicon Via) that penetrates the substrate 100. The contact pad 110 may be made of, for example, metal, such as aluminum (Al).

Then, a pre-insulating layer that covers the substrate 100 and the contact pad 110 is formed. That is, the pre-insulating layer covers the contact pad 110 and one surface 100a of the substrate on which the contact pad 110 is formed. An insulating layer 120 that includes a first opening 120t is formed through removal of a part of the pre-insulating layer in a photographic process and an etching process. The first opening 120t exposes at least a part of the contact pad. The insulating layer 120 may include, for example, a nitride layer or an oxide layer.

In an embodiment, a protection layer may be further formed on the insulating layer 120. The protection layer may include, for example, polyamide, but is not limited thereto.

Then, a conductive layer 130p may be conformally formed on one surface 100a of the substrate. The conductive layer 130p may be formed on the insulating layer 120 and the first opening 120t. The conductive layer 130p is formed even on the contact pad 110 that is exposed by the first opening 120t. The conductive layer 130p may be formed, for example, in a sputtering method.

In the following plating process, the conductive layer 130p may be a UBM (Under Bump Metallurgy) that serves as an adhesive layer between a lower bump 210 (in FIG. 4) and the contact pad 110, a diffusion prevention layer, and a wetting layer. The conductive layer 130 may be formed of, for example, a multilayer structure in which various kinds of metals, such as, chrome (Cr), copper (Cu), nickel (Ni), titanium-tungsten (TiW), and nickel-vanadium (NiV). As an example, the conductive layer 130p may be formed of a Ti/Cu, Cr/Cr—Cu/Cu, TiW/Cu, Al/NiV/Cu, or Ti/Cu/Ni structure. The conductive layer 130p may be used as a seed layer in the subsequent plating process.

Referring to FIG. 3, a photosensitive layer pattern 140 that includes a second opening 140t is formed on the conductive layer 130p. The second opening 140t is formed on the contact pad 110 to expose the conductive layer 130p formed on the contact pad 110. The width of the first opening 120t may be smaller than the width of the second opening 140t. The first opening 120t may substantially completely overlap the second opening 140t.

The photosensitive layer pattern 140 may be formed of, for example, positive photoresist or negative photoresist. Various kinds of materials may be used as the photoresist according to the kind of light sources used in the exposure process and the shape of the pattern to be formed. The light source may be, for example, an ArF (193 nm), KrF (248 nm), EUV (Extreme Ultra Violet), VUV (Vacuum Ultra Violet, 157 nm), E-beam, X-ray, or ion beam, but is not limited thereto.

Referring to FIG. 4, a bump pattern 200 may be formed on the conductive pattern 130p. The bump pattern 200 overlaps the contact pad 110, and includes a lower bump 210 and an upper bump pattern 220 that are sequentially laminated on the contact pad 110. The lower bump 210 and the upper bump pattern 220 may be sequentially formed by filling the first opening 120t and the second opening 140t with a conductive material.

In an embodiment, the surface of the conductive layer 130p that is exposed by the second opening 140t can be cleaned. As a method for cleaning the surface of the conductive layer 130p, for example, a descum method that is a kind of dry etching may be used.

Then, the lower bump 210 may be formed on the cleaned conductive layer 130p. The lower bump 210 may fill a part of the second opening 140t and the first opening 120t. The lower bump 210 may be formed, for example, by electroplating. The lower bump 210 may be made of various kinds of metals, such as nickel (Ni), copper (Cu), palladium (PD), platinum (Pt), gold (Au), and a combination thereof.

Then, the upper bump pattern 220 that fills a part of the second opening 140t is formed on the lower bump 210. The upper bump pattern 220 may be formed, for example, by electroplating. The upper bump pattern 220 may include, for example, tin. In an embodiment, the upper bump pattern 220 does not include other metals except for tin. That is the upper bump pattern 220 may be a pure tin layer.

The upper bump pattern 220 may be formed using the tin plating solution as described above using FIG. 1. In an embodiment, the upper bump pattern 220 may be formed using the tin plating solution that includes an aliphatic sulfonic acid having the carbon number of 1 to 10, an anti-oxidant, a wetting agent that is a polycyclic aromatic compound, and a grain refiner that is an aromatic carbonyl compound.

Referring to FIG. 5, the photosensitive pattern 140 that surrounds the bump pattern 200 is removed. Through this, the bump pattern 200 that projects from the conductive layer 130p remains on the bump pattern 200.

Then, the conductive pattern 130 can be formed on the insulating layer through removal of the conductive layer that does not overlap the bump pattern 200. Removal of a part of the conductive layer may be performed, for example, wet etching, but is not limited thereto.

Referring to FIG. 6, heat treatment of the upper bump pattern 220 is performed through a reflow process.

Through the reflow process, the shape of the upper bump pattern 220 may be changed to the upper bump 220a having a curved outer surface.

Accordingly, a bump 202 that includes the lower bump 210 and the upper bump 220a is formed on the conductive pattern 130.

Referring to FIGS. 2, 3, and 5 to 7, a method for fabricating a semiconductor device according to another embodiment of the present invention will be described.

FIG. 7 is a view explaining a method for fabricating a semiconductor device according to another embodiment of the present invention.

Referring to FIG. 7, the upper bump pattern 220 includes a first upper bump pattern 222 and a second upper bump pattern 224 that are sequentially formed on the lower bump 210.

In an embodiment, the first upper bump pattern 222 may be formed on the lower bump 210. The first upper bump pattern 222 may fill a part of the second opening 140t. The first upper bump pattern 222 may be formed, for example, by electroplating.

Then, the second upper bump pattern 224 may be formed on the first upper bump pattern 222. The second upper bump pattern 224 may fill a part of the second opening 140t. The second upper bump pattern 224 may be formed, for example, by electroplating.

In the method for fabricating a semiconductor device according to another embodiment of the present invention, the first upper bump pattern 222 may include tin, and the second upper bump pattern 224 may include, for example, one of a tin-silver alloy (SnAg) and tin-lead (SnPb). In an embodiment, the first upper bump pattern 222 may be formed as a pure tin layer, and the second upper bump pattern 224 may be formed as an alloy layer that includes one of the tin-silver alloy (SnAg) and tin-lead (SnPb).

In a method for fabricating a semiconductor device according to another embodiment of the present invention, the first upper bump pattern 222 may include, for example, one of a tin-silver alloy (SnAg) and a tin-lead (SnPb), and the second bump pattern 224 may include tin. More specifically, the first upper bump pattern 222 is formed to as an alloy layer that includes one of the tin-silver alloy (SnAg) and tin-lead (SnPb), and the second upper bump pattern 224 is formed as a pure tin layer.

FIG. 7 illustrates that the upper bump pattern 220 is provided by once forming the first upper bump pattern 222 and the second upper bump pattern 224, but is not limited thereto. That is, the upper bump pattern 220 may also be formed by repeatedly laminating the first upper bump pattern 222 and the second upper bump pattern 224 several times. When the first upper bump pattern 222 and the second upper bump pattern 224 are repeatedly laminated several times, the bump pattern 200 may be completed as the first upper bump pattern 222.

Then, through a reflow process, the shape of the upper bump pattern 220 may be changed to the upper bump 220a having a curved outer surface.

Referring to FIGS. 2, 3, and 8 to 10, a method for fabricating a semiconductor device according to still another embodiment of the present invention will be described.

FIGS. 8 to 10 are views explaining a method for fabricating a semiconductor device according to still another embodiment of the present invention.

Referring to FIG. 8, a solder ball pattern 250 may be formed on the conductive pattern 130p. The solder ball pattern 250 overlaps the contact pad 110, and includes a lower solder ball pattern 260 and an upper solder ball pattern 270 that are sequentially laminated on the contact pad 110. The lower solder ball pattern 260 and the upper solder ball pattern 270 may be sequentially formed by filling the first opening 120t and the second opening 140t with a conductive material.

In an embodiment, the surface of the conductive layer 130p that is exposed by the second opening 140t can be cleaned. As a method for cleaning the surface of the conductive layer 130p, for example, a descum method that is a kind of dry etching may be used.

Then, the lower solder ball pattern 260 may be formed on the conductive layer 130p. The lower solder ball pattern 260 may fill a part of the second opening 140t and the first opening 120t. The lower solder ball pattern 260 may be formed, for example, by electroplating.

Then, the upper solder ball pattern 270 may be formed on the lower solder ball pattern 260. The upper solder ball pattern 270 may fill a part of the second opening 140t. The upper solder ball pattern 270 may be formed, for example, by electroplating.

In the method for fabricating a semiconductor device according to still another embodiment of the present invention, the lower solder ball pattern 260 may include tin, and the upper solder ball pattern 270 may include, for example, one of a tin-silver alloy (SnAg) and tin-lead (SnPb). In an embodiment, the lower solder ball pattern 260 may be formed as a pure tin layer, and the upper solder ball pattern 270 may be formed as an alloy layer that includes one of the tin-silver alloy (SnAg) and tin-lead (SnPb).

In a method for fabricating a semiconductor device according to still another embodiment of the present invention, the lower solder ball pattern 260 may include, for example, one of the tin-silver alloy (SnAg) and the tin-lead (SnPb), and the upper solder ball pattern 270 may include tin. In an embodiment, the lower solder ball pattern 260 is formed as an alloy layer that includes one of the tin-silver alloy (SnAg) and tin-lead (SnPb), and the upper solder ball pattern 270 is formed as a pure tin layer.

FIG. 8 illustrates that the solder ball pattern 250 is provided by once forming the lower solder ball pattern 260 and the upper solder ball pattern 270, but is not limited thereto. That is, the solder ball pattern 250 may also be formed by repeatedly laminating the lower solder ball pattern 260 and the upper solder ball pattern 270 several times. When the lower solder ball pattern 260 and the upper solder ball pattern 270 are repeatedly laminated several times, the solder ball pattern 250 may be completed as the lower solder ball pattern 260.

FIG. 8 illustrates that the solder ball pattern 250 has a multilayer structure, but is not limited thereto. That is, the solder ball pattern 250 may be formed as a pure tin layer.

Referring to FIG. 9, the photosensitive layer pattern 140 that surrounds the solder ball pattern 250 is removed. Through this, the solder ball pattern 250 that projects from the conductive layer 130p remains on the substrate 100.

Then, the conductive pattern 130 can be formed on the insulating layer 120 through removal of the conductive layer that does not overlap the solder ball pattern 250.

Referring to FIG. 10, through a reflow process, heat treatment of the solder ball pattern is performed.

Through the reflow process, the shape of the solder ball pattern 250 may be changed to a solder ball 252 having a curved outer surface.

[Experimental Example] Evaluation of a Grain Size of a Tin Bump and Plating Speed According to a Grain Refiner and a Wetting Agent Included in a Tin Plating Solution 1. Comparative Example In a tin plating solution used as a comparative example, a compound that is expressed by Formula 5 was used as a grain refiner. The compound expressed by Formula 5 is substituted or non-substituted benzocyclopentadiene.

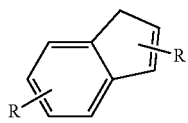

[Formula 5]

In the tin plating solution used as the comparative example, a compound that is expressed by Formula 6 was used as the wetting agent. The compound expressed by Formula 6 is polyether.

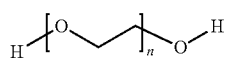

[Formula 6]

Further, in the tin plating solution used as the comparative example, hydroquinone was used as the anti-oxidant.

In the tin plating solution used as the comparative example, the concentration of the grain refiner was 0.1 g/L, the concentration of the wetting agent was 50 g/L, and the concentration of the anti-oxidant was 0.1 g/L.

2. Experimental Example

In a tin plating solution according to the present invention used as an experimental example, a compound expressed by Formula 3 was used.

In the tin plating solution according to the present invention used as the experimental example, the concentration of the grain refiner was 0.1 g/L, the concentration of the wetting agent was 50 g/L, and the concentration of the anti-oxidant was 0.1 g/L.

3. Evaluation

The results of the measurement after plating a tin bump using the comparative example and the experimental example as described above are shown in FIG. 11.

Referring to FIG. 11, in the case of the tin bump (left drawing) formed using the comparative example, the grain size of the tin is large, and thus the surface of the tin bump is very rough. However, in the case of the tin bump (right drawing) formed using the experimental example, the grain size of the tin is small, and thus the surface of the tin bump is relative smooth. In an embodiment, the grain size of the tin bump formed using the comparative example is larger than 10 μm, but the grain size of the tin bump formed using the experimental example is smaller than 2 μm.

In addition, when the tin bump is formed using the comparative example, the plating speed is about 0.5 μm/min. However, when the tin bump is formed using the experimental example, the plating speed is about 4 μm/min.

Accordingly, in the case of forming the tin bump using the tin plating solution according to the present invention, the grain size of the tin bump becomes smaller than that according to the comparative example, but the plating speed of the tin bump becomes faster than that according to the comparative example.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A tin plating solution comprising:
   tin ions;
   an aliphatic sulfonic acid having a carbon number in a range of 1 to 10;
   an anti-oxidant;
   a wetting agent; and
   a grain refiner that is an aromatic carbonyl compound,
   wherein the wetting agent is represented by Formula 2, 3, or 4:

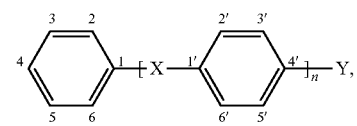

[Formula 2]

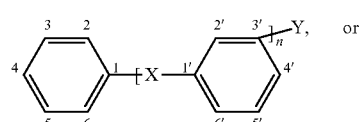

[Formula 3]

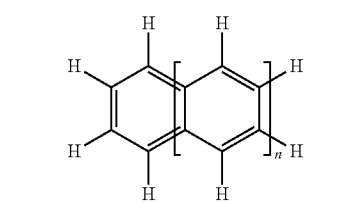

[Formula 4]

wherein in Formula 2 and Formula 3, n is in a range of 1 to 3, X includes at least one of O, S, SO, $SO_2$, $CH_2$, $CH_2CH_2$, $CH_2CH_2CH_2$ and $CHCH_3$, and Y is selected from the group consisting of a hydrogen group, hydroxyl group, sulfhydryl group, alkyl group having a carbon number in a range of 1 to 24, aliphatic alkoxyl group, alkyl thioalkoxyl group having a carbon number in a range of 1 to 10, fluorine group, chloro group, and bromo group, and wherein in Formula 4, n is in a range of 1 to 6.

2. The tin plating solution of claim 1, wherein the grain refiner is represented by Formula 1:

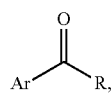

[Formula 1]

wherein Ar is at least one aromatic ring and R is a hydrogen group or an alkyl group.

3. The tin plating solution of claim 2, wherein R is selected from the group consisting of a hydrogen group (—H), paraffin group (—$C_nH_{2n+1}$), and cycloparaffin group (—$C_mH_{2m-1}$), and n is equal to or greater than 1, and m is equal to or greater than 2.

4. The tin plating solution of claim 1, wherein the aliphatic sulfonic acid is methane sulfonic acid.

5. The tin plating solution of claim 1, wherein the anti-oxidant comprises one of hydroquinone and orange acid.

6. The tin plating solution of claim 1, wherein a concentration of the aliphatic sulfonic acid is in a range of 225 to 350 ml/L.

7. The tin plating solution of claim 1, wherein a concentration of the tin ions is in a range of 50 to 100 g/L.

8. The tin plating solution of claim 1, wherein the tin ions are supplied from a soluble tin electrode.

9. A method for fabricating a semiconductor device comprising:

forming a contact pad on a substrate; and forming a pure tin bump on the contact pad using a tin plating solution, wherein the tin plating solution includes an aliphatic sulfonic acid having a carbon number in a range of 1 to 10, an anti-oxidant, a wetting agent that is a polycyclic aromatic compound, and a grain refiner that is an aromatic carbonyl compound, wherein the polycyclic aromatic compound is represented by Formula 2, 3, or 4:

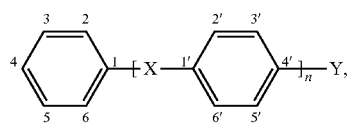

[Formula 2]

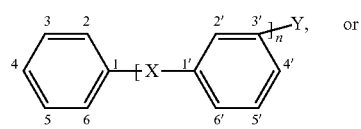

[Formula 3]

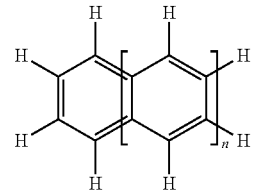

[Formula 4]

wherein in Formula 2 and Formula 3, n is in a range of 1 to 3, X includes at least one of O, S, SO, $SO_2$, $CH_2$, $CH_2CH_2$, $CH_2CH_2CH_2$ and $CHCH_3$, and Y is selected from the group consisting of a hydrogen group, hydroxyl group, sulfhydryl group, alkyl group having a carbon number in a range of 1 to 24, aliphatic alkoxyl group, alkyl thioalkoxyl group having a carbon number in a range of 1 to 10, fluorine group, chloro group, and bromo group, and wherein in Formula 4, n is in a range of 1 to 6.

10. The method of claim 9, wherein the grain refiner is represented by Formula 1:

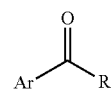

[Formula 1]

wherein Ar is at least one aromatic ring, and R is selected from the group consisting of a hydrogen group (—H), paraffin group (—$C_nH_{2n+1}$), and cycloparaffin group (—$C_mH_{2m-1}$), and n is equal to or greater than 1, and m is equal to or greater than 2.

11. The method of claim 9, wherein the polycyclic aromatic compound further includes an alkyl group which has a carbon number in a range of 10 to 24 and is combined with position 3, 4, or 5 of Formula 2 or Formula 3.

12. The method of claim 9, wherein forming the pure tin bump on the contact pad using the tin plating solution comprises:

forming a photosensitive layer pattern that includes an opening formed on the contact pad;

forming a pure tin layer that fills a portion of the opening using the tin plating solution; and performing heat treatment of the pure tin layer through a reflow process.

13. The method of claim 12, further comprising forming a conductive layer that fills a portion of the opening on the pure tin layer after forming the pure tin layer.

14. The method of claim 12, further comprising forming a conductive layer that fills a portion of the opening before forming the pure tin layer.

15. The method of claim 9, wherein the grain refiner is represented by Formula 1:

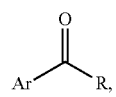

[Formula 1]

wherein Ar is at least one aromatic ring and R is a hydrogen group or an alkyl group.

16. The method of claim 15, wherein R is selected from the group consisting of a hydrogen group (—H), paraffin group (—$C_nH_{2n+1}$), and cycloparaffin group (—$C_mH_{2m-1}$), and n is equal to or greater than 1, and m is equal to or greater than 2.

17. The method of claim 9, wherein the aliphatic sulfonic acid is methane sulfonic acid.

18. The method of claim 9, wherein the anti-oxidant comprises one of hydroquinone and orange acid.

19. The method of claim 9, wherein a concentration of the aliphatic sulfonic acid is in a range of 225 to 350 ml/L.

20. The method of claim 9, wherein the tin plating solution further comprises tin ions at a concentration in a range of 50 to 100 g/L.

\* \* \* \* \*